United States Patent
Seo

(10) Patent No.: US 11,899,429 B2
(45) Date of Patent: Feb. 13, 2024

(54) CONTROLLING APPARATUS FOR CONTROLLING OPERATION OF SUBSTRATE PROCESSING APPARATUS

(71) Applicant: SEMES CO., LTD., Cheonan-si (KR)

(72) Inventor: Sang Bo Seo, Yongin-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/561,649

(22) Filed: Dec. 23, 2021

(65) Prior Publication Data

US 2022/0206467 A1 Jun. 30, 2022

(30) Foreign Application Priority Data

Dec. 24, 2020 (KR) ........................ 10-2020-0183645

(51) Int. Cl.
*G05B 19/4155* (2006.01)
*H01L 21/67* (2006.01)

(52) U.S. Cl.
CPC ............... *G05B 19/4155* (2013.01); *G05B 2219/45031* (2013.01); *H01L 21/67167* (2013.01)

(58) Field of Classification Search
None
See application file for complete search history.

(56) References Cited

U.S. PATENT DOCUMENTS

| 10,984,991 | B2 | 4/2021 | Mizuguchi et al. |
| 2004/0243256 | A1* | 12/2004 | Willis ................ G05B 19/4183 700/79 |
| 2015/0066185 | A1 | 3/2015 | Kim et al. |
| 2018/0224839 | A1 | 8/2018 | Takahara et al. |

FOREIGN PATENT DOCUMENTS

| KR | 10-2015-0028077 | 3/2015 |
| KR | 10-2018-0092279 | 8/2018 |
| KR | 10-2020-0051451 | 5/2020 |

* cited by examiner

*Primary Examiner* — Ryan A Jarrett

(57) ABSTRACT

A controlling apparatus for controlling operation of a substrate processing apparatus includes a first CTC, and a second CTC. When the first CTC stops operating, the second CTC is preset to control each module in the substrate processing apparatus in place of the first CTC. As the first CTC and the second CTC are dualized to provide the controlling apparatus, even when one of the CTCs stops operating, another dualized CTC is used to control the substrate processing apparatus, so that operation-stop of the substrate processing system is prevented and entire process efficiency is increased.

16 Claims, 8 Drawing Sheets

CONTROLLING APPARATUS FOR CONTROLLING OPERATION OF SUBSTRATE PROCESSING APPARATUS

CROSS REFERENCE TO RELATED APPLICATION

The present application claims priority to Korean Patent Application No. 10-2020-0183645, filed Dec. 24, 2020, the entire contents of which is incorporated herein for all purposes by this reference.

BACKGROUND OF THE INVENTION

Field of the Invention

The present disclosure relates generally to a controlling apparatus for controlling operation of a substrate processing apparatus and, more particularly, to a controlling apparatus configured to prevent stoppage of a substrate processing apparatus and a substrate processing system including the same.

Description of the Related Art

A semiconductor (or display) manufacturing process is a process for manufacturing a semiconductor device on a substrate (e.g., wafer). For example, the semiconductor manufacturing process includes processes of exposure, deposition, etching, ion implantation, cleaning, and the like. A Substrate processing system provided for performing semiconductor manufacturing processes is arranged in a clean room, and the processes are performed in order as a substrate is transferred to semiconductor manufacturing equipment by a transfer vehicle (e.g., overhead hoist transport, OHT).

Each module performing transfer and process is arranged in the semiconductor manufacturing equipment, and a controller for controlling each module is provided in the semiconductor manufacturing equipment. A main controller for assigning operation to each module and controller and transmitting commands is provided in the semiconductor manufacturing equipment. The main controller may be referred to a cluster tool controller (CTC).

However, the CTC stops operating due to a program error or maintenance therein, the whole substrate processing system may stop operating, resulting a delay of the whole process.

SUMMARY OF THE INVENTION

Accordingly, the present invention is intended to provide a controlling apparatus configured to enable the substrate processing apparatus to normally operate even when a cluster tool controller (CTC) stops operating, and to provide a substrate processing system including the same.

The problem to be solved is not limited thereto, and other problems not mentioned will be clearly understood by those skilled in the art from the subsequent description.

In order to achieve the above objective, according to one aspect of the present disclosure, there is provided a controlling apparatus for controlling operation of a substrate processing apparatus, the controlling apparatus including: a first cluster tool controller (CTC) configured to control each processing module of the substrate processing apparatus; and a second CTC having the same configuration of a software and a hardware as configuration of a software and a hardware of the first CTC, wherein, when the first CTC stops operating, the second CTC may control each module of the substrate processing apparatus in place of the first CTC.

The first CTC may include: a first processing unit configured to process data for controlling each module of the substrate processing apparatus; a first storage unit configured to store the data for controlling each module of the substrate processing apparatus; and a first interface unit configured to perform data exchanging with the second CTC The second CTC may include: a second processing unit configured to process the data for controlling each module of the substrate processing apparatus while operating in synchronization with the first processing unit; a second storage unit configured to store the data for controlling each module of the substrate processing apparatus while operating in synchronization with the first storage unit; and a second interface unit configured to perform data exchanging with the first CTC.

Each of the first storage unit and the second storage unit may be configured to store therein an operation system configured to control the substrate processing apparatus, an application configured to operate in environment of the operation system, and a virtual machine configured to synchronize the first CTC and the second CTC.

The first CTC may be configured to generate CTC operation information about a substrate loaded onto the substrate processing apparatus, a transfer command for transferring the substrate on the basis of the CTC operation information, and a processing command for processing the substrate on the basis of the CTC operation information.

The second CTC may be configured to copy and store the CTC operation information, the transfer command, and the processing command.

The second CTC may be configured to detect an error in the first CTC, and, when an error occurs in the first CTC, to generate and transmit the operation for controlling each module of the substrate processing apparatus in place of the first CTC.

When the first CTC is restored, the second CTC may transmit commands and data, which may be stored from time when the first CTC stops operating, to the first CTC.

According to one aspect of the present disclosure, there is provided an operation method of controlling a controlling apparatus, the controlling apparatus including a first cluster tool controller (CTC) configured to control each processing module of a plurality of processing module in a substrate processing apparatus and a second CTC having the same configuration of a software and a hardware as configuration of a software and a hardware of the first CTC, the operation method including: generating, by the first CTC, commands and data for each processing module of the plurality of processing modules in the substrate processing apparatus; controlling, by the first CTC, each processing module of the plurality of processing modules in the substrate processing apparatus based on the commands and data; generating, by the second CTC, the commands and data synchronized with the first CTC; and controlling, by the second CTC in place of the first CTC in response to when the first CTC stops, each processing module of the plurality of processing modules in the substrate processing apparatus based on the commands and data generated by the second CTC.

The controlling, by the first CTC, each module of the substrate processing apparatus may include: generating CTC operation information about a substrate loaded onto the substrate processing apparatus; generating a transfer command for transferring the substrate on the basis of the CTC operation information; and generating a processing command for processing the substrate on the basis of the CTC operation information.

The generating, by the second CTC, the commands and data synchronized with the first CTC may include: copying and storing the CTC operation information; copying and storing the transfer command; and copying and storing the processing command.

The controlling, by the second CTC, each module of the substrate processing apparatus may include: when an error occurs in the first CTC, generating and transmitting, by the second CTC in place of the first CTC, operation for controlling each module of the substrate processing apparatus.

The operation method may include: when the first CTC is recovered, transmitting, by the second CTC, commands and data, which may be stored from time when the first CTC stops operating, to the first CTC.

According to an embodiment of the present disclosure, there is provided a substrate processing system includes: a transfer module configured to transfer a substrate; a processing module configured to perform a fabrication process on the substrate; and a controlling module, wherein the controlling module may include: a first cluster tool controller (CTC) configured to control the transfer module and the processing module; and a second CTC having the same configuration of a software and a hardware as configuration of a software and a hardware of the first CTC. When the first CTC stops operating, the second CTC may control the transfer module and the processing module in place of the first CTC.

The first CTC may include: a first processing unit configured to process data for controlling the transfer module and the processing module; a first storage unit configured to store the data for controlling the transfer module and the processing module; and a first interface unit configured to perform data exchanging with the second CTC.

The second CTC may include: a second processing unit configured to process the data for controlling the transfer module and the processing module of the substrate processing apparatus while operating in synchronization with the first processing unit; a second storage unit configured to store the data for controlling the transfer module and the processing module of the substrate processing apparatus while operating in synchronization with the first storage unit; and a second interface unit configured to perform data exchanging with the first CTC.

Each of the first storage unit and the second storage unit may be configured to store therein an operation system configured to control the transfer module and the processing module, an application configured to operate in environment of the operation system, and a virtual machine configured to synchronize the first CTC and the second CTC.

The first CTC may be configured to generate CTC operation information about a substrate loaded onto the transfer module, a transfer command for transferring the substrate on the basis of the CTC operation information, and a processing command for processing the substrate on the basis of the CTC operation information.

The second CTC may be configured, when receiving the CTC operation information from the first CTC, to copy and store the CTC operation information, and the second CTC may be configured, when receiving the transfer command from the first CTC, to copy and store the transfer command, and the second CTC may be configured, when receiving the processing command from the first CTC, to copy and store the processing command.

The second CTC may be configured to detect an error in the first CTC, and the second CTC may be configured, when an error occurs in the first CTC, to generate and transmit operation for controlling the transfer module and the processing module in place of the first CTC, and the second CTC may be configured, when the first CTC is restored, to transmit commands and data, which are stored from time when the first CTC stops operating, to the first CTC.

According to an embodiment of the present disclosure, the controlling apparatus includes dualized first cluster tool controller (CTC) and second CTC. Therefore, even when one of the CTCs stops operating, another CTC is used to control the substrate processing apparatus, so that operation stop of the substrate processing system can be prevented and overall process efficiency can be increased.

The effect of the present disclosure is not limited to the above description, and other effects not mentioned will be clearly understood by those skilled in the art from the subsequent description.

BRIEF DESCRIPTION OF THE DRAWINGS

The above and other objectives, features, and other advantages of the present disclosure will be more clearly understood from the subsequent detailed description when taken in conjunction with the accompanying drawings, in which.

DETAILED DESCRIPTION OF THE INVENTION

Figure 1:
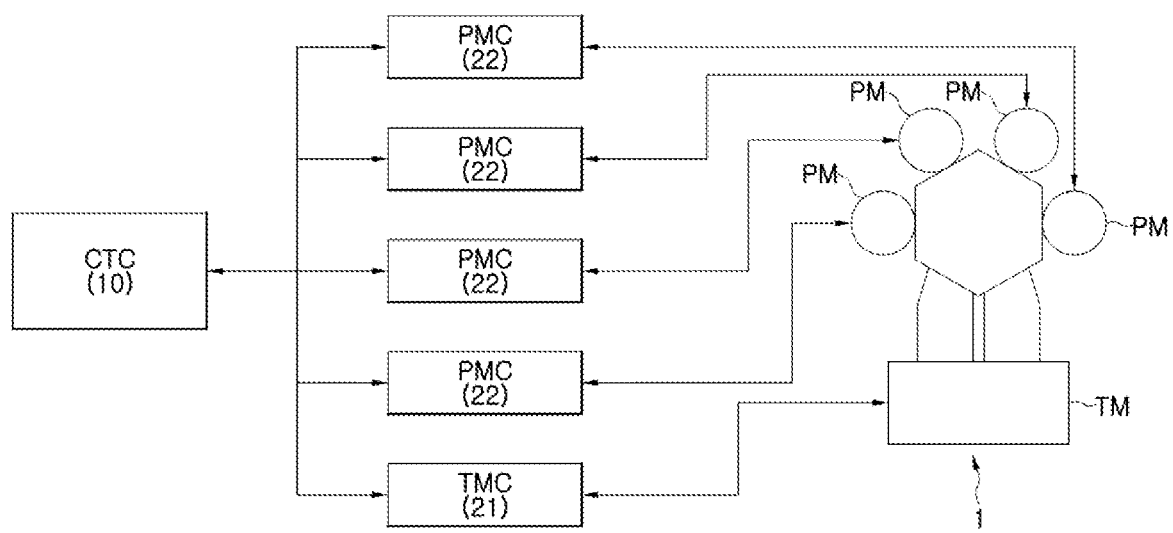
FIG. 1 is a view showing an example of configuration of a substrate processing system and a controller for controlling the substrate processing system.

Hereinbelow, exemplary embodiments of the present disclosure will be described in detail with reference to the accompanying drawings such that the present disclosure can be easily embodied by one of ordinary skill in the art to which the present disclosure belongs. However, the present disclosure may be changed to various embodiments and the scope and spirit of the present disclosure are not limited to the embodiments described hereinbelow.

In the subsequent description, if it is decided that the detailed description of known function or configuration related to the present disclosure makes the subject matter of the present disclosure unclear, the detailed description is omitted, and the same reference numerals will be used throughout the drawings to refer to the elements or parts with a same or similar function or operation.

Furthermore, in various embodiments, elements with the same configuration will be described in a representative embodiment by using the same reference numeral, and different configurations from the representative embodiment will be described in other embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words, such as "between" versus "directly between", "adjacent" versus "directly adjacent", etc., used to describe the relationship between elements should be interpreted in a like fashion. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

In the flowing description, unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a view showing an example of configuration of a substrate processing apparatus and a controller for controlling the substrate processing apparatus.

Referring to FIG. 1, the present disclosure includes a substrate processing apparatus 1 for performing a semiconductor process, a controller 21, 22 controlling each module of the substrate processing apparatus, and a cluster tool controller (CTC) 10 controlling each controller 21, 22.

The substrate processing apparatus includes a transfer module TM transferring a substrate loaded onto the substrate processing apparatus, and a processing module PM performing a process with respect to the substrate. As shown in FIG. 1, the processing module PM in which the substrate processing is performed may include a plurality of processing modules PM. Furthermore, other additional modules such as a device for creating the environment (e.g., vacuum) in the processing module PM may be provided in a substrate processing system.

The transfer module TM and the processing module PM are controlled by each controller corresponding thereto. For example, the substrate processing system may include a transfer module controller (TMC) 21 for controlling the transfer module TM, and a processing module controller (PMC) 22 for controlling the processing module PM. The TMC 21 may control a transfer robot to transfer a substrate, and the PMC 22 may control a process of processing a substrate by the processing module PM. For example, the TMC 21 may control substrate pick-up operation of the transfer robot and horizontal and vertical movements of the transfer robot. The PMC 22 may control an input volume of process gas, temperature, air pressure, etc.

The CTC 10 may control entire operation of the substrate processing system. As shown in FIG. 1, the CTC 10 may control each of the modules of the substrate processing system by the TMC 21 and the PMC 22. For example, the CTC 10 may determine whether the substrate loaded on the substrate processing apparatus is transferred to the processing module PM, and transmit a transfer command to the TMC 21. The CTC 10 may transmit recipe information to the PMC 22, the recipe information being for processing the substrate in the processing module PM and including a type of processing gas, processing time, temperature profile, etc.

Figure 2:
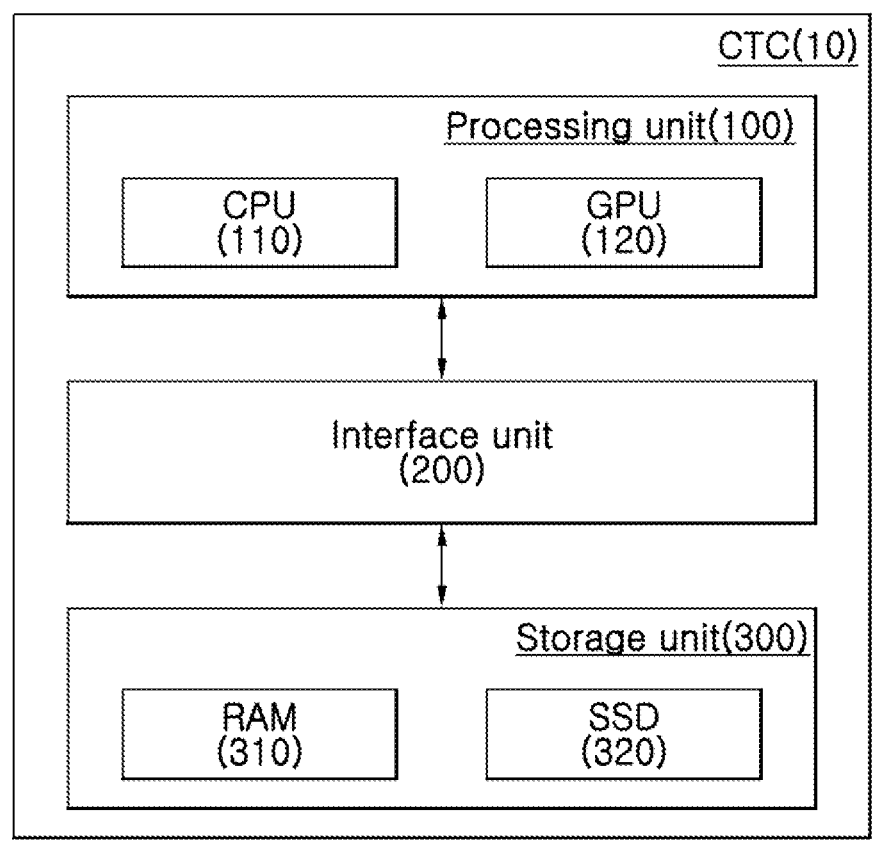
FIG. 2 is an indicative block diagram showing a cluster tool controller (CTC) controlling entire operation of the substrate processing system.

FIG. 2 is an indicative block diagram showing the CTC controlling the entire operation of the substrate processing system.

Referring to FIG. 2, the CTC 10 includes a processing unit 100 processing data for controlling each module in the substrate processing system, an interface unit 200 (e.g., motherboard) for exchanging the data, and a storage unit 300 storing the data for controlling each module. The processing unit 100 may include a central processing unit (CPU) 110 and a graphic processing unit (GPU) 120. The storage unit 300 may include a random access memory (RAM) 310 and a solid state drive (SSD) 320.

Figure 3:
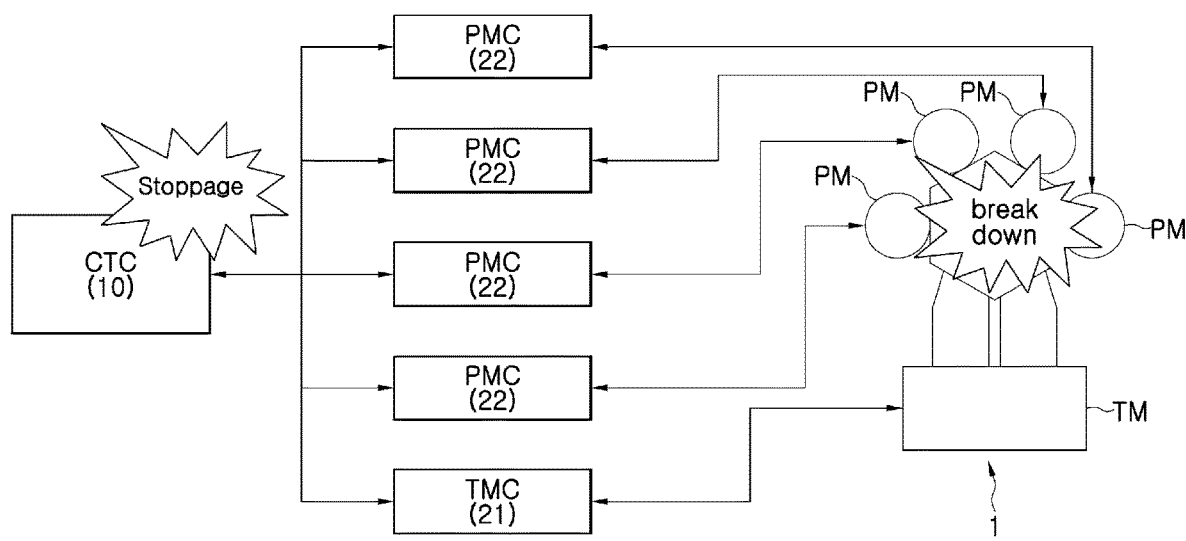
FIG. 3 is a view showing a situation in which the whole substrate processing system stops operating when an error occurs in the CTC.

FIG. 3 is a view showing a situation in which the whole substrate processing system stops operating when an error occurs in the CTC.

As shown in FIG. 3, since the whole substrate processing system is controlled by the CTC 10, when an error occurs in the CTC 10 or the CTC 10 stops operating due to updating of the software in the CTC 10, operation of the substrate processing system stops operating. Therefore, although the module in the substrate processing system can normally operate, operation thereof is not possible as the CTC 10 stops operating. The operation of the module causes a delay of the overall process, resulting in a decrease in process efficiency.

Therefore, the embodiment of the present disclosure provides a method of operating the CTC 10 without operation stop, the CTC 10 controlling the whole substrate processing system. The present disclosure may control the whole substrate processing system without operation stop of a system by adopting the CTC 10 dualized in aspect of hardware and software. Since a failure of the CTC 10 causes the operation stop of the entire system of the whole substrate processing system, annual operation-stop loss increases and thus causes a major obstacle to the facility utilization rate. With introduction of CTC dualization technology, the substrate processing system operates without operation stop regardless of a failure or replacement of the CTC 10. Therefore, the present disclosure has effects such as operation-stop loss reduction, productivity improvement, cost reduction, etc.

Figure 4:
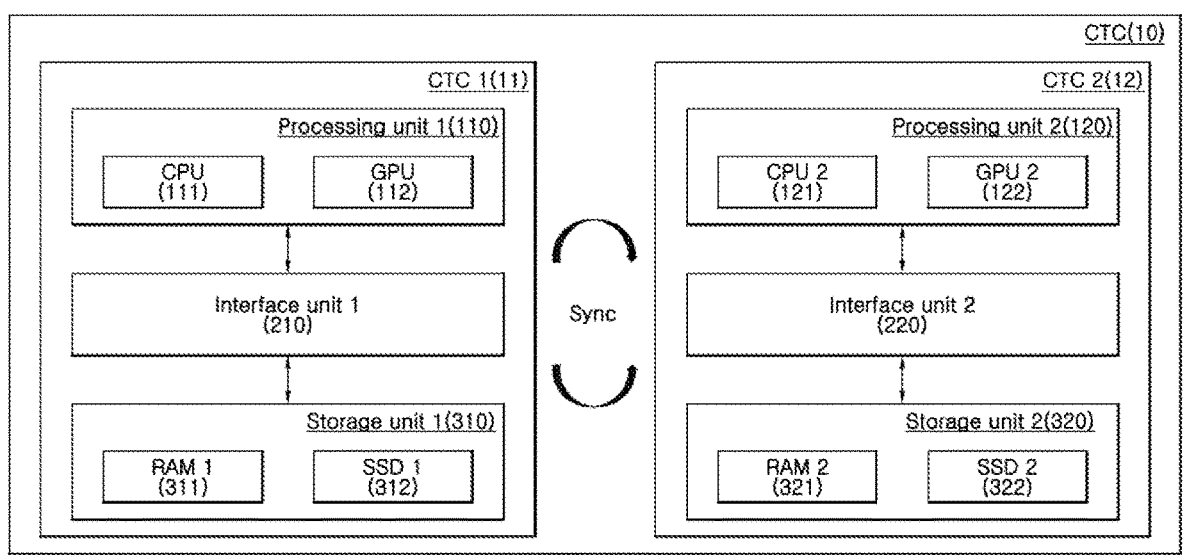
FIG. 4 is a view showing configuration of dualized CTCs according to an embodiment of the present disclosure.

FIG. 4 is a view showing configuration of dualized CTCs according to an embodiment of the present disclosure. According to the embodiment of the present disclosure, the CTC 10 controlling the operation of the substrate processing apparatus 1 includes a first CTC 11 controlling each module TM, PM of the substrate processing system, and a second CTC 12 preset to perform the same operation as the operation of the first CTC 11 while having the same configuration of a software and a hardware as the configuration of the first CTC 11. The second CTC 12 is preset to control each module TM, PM of the substrate processing apparatus 1 in place of the first CTC 11 when the first CTC 11 stops operating.

The first CTC 11 may include a first processing unit 110 processing the data for controlling each module TM, PM, a first storage unit 310 storing the data for controlling each module TM, PM, and a first interface unit 210 exchanging the data with the second CTC 12.

The second CTC 12 may include a second processing unit 120 synchronized with the first processing unit 110 and processing the data for controlling each module TM, PM, a second storage unit 320 synchronized with the first storage unit 310 and storing the data for controlling each module TM, PM, and a second interface unit 220 for data exchanging with the first CTC 11.

Figure 5:
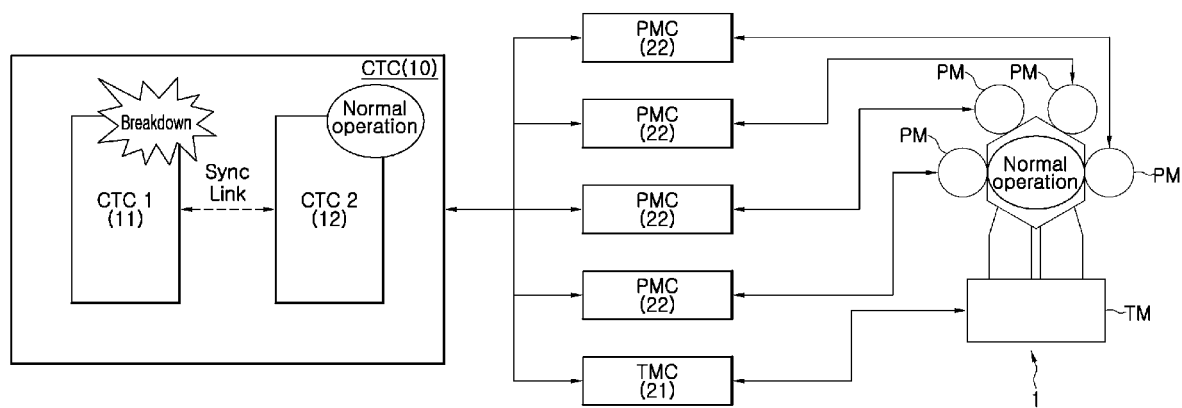
FIG. 5 is a view showing a situation in which, when an error occurs in one of the CTCs, another CTC controls the substrate processing system.

FIG. 5 is a view showing a situation in which, when an error occurs in one of the CTCs, another CTC controls the substrate processing system.

As shown in FIG. 5, as the first CTC 11 and the second CTC 12 operate while being synchronized with each other, even when the first CTC 11 normally controlling the operation of the substrate processing apparatus 1 stops operating, the second CTC 12 replaces the first CTC to control the substrate processing apparatus 1, so that the substrate processing apparatus 1 may be operated without operation stop.

Figure 6:
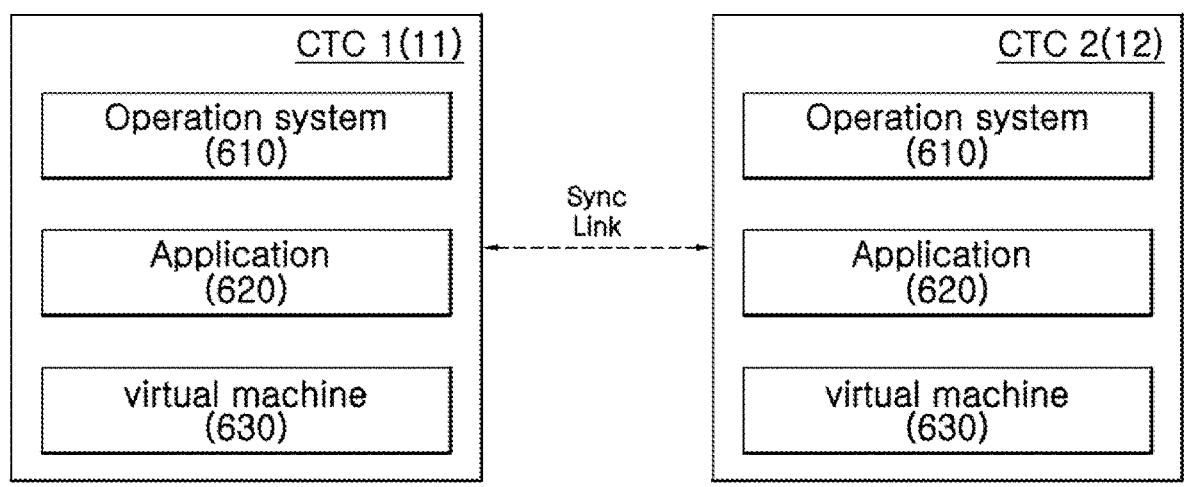
FIG. 6 is a view showing the CTCs operating while being synchronized with each other.

FIG. 6 is a view showing the CTCs operating while being synchronized with each other.

According to the embodiment of the present disclosure, each of the first storage unit 310 and second storage unit 320 is preset to store an operation system 610 (e.g., Windows, Linux) for controlling the substrate processing apparatus 1, an application 620 operating in environment of the operation system 610, and a virtual machine 630 for synchronization between the first CTC 11 and the second CTC 12.

The first CTC 11 and the second CTC 12 may perform synchronized operations using data synchronized through a communication module or an IO (input-output) module provided in each of the first interface unit 210 and the second interface unit 220. For example, the second CTC 12 may perform operation performed by the virtual machine 630 in the first CTC 11 as it is, and vice versa.

Figure 7:
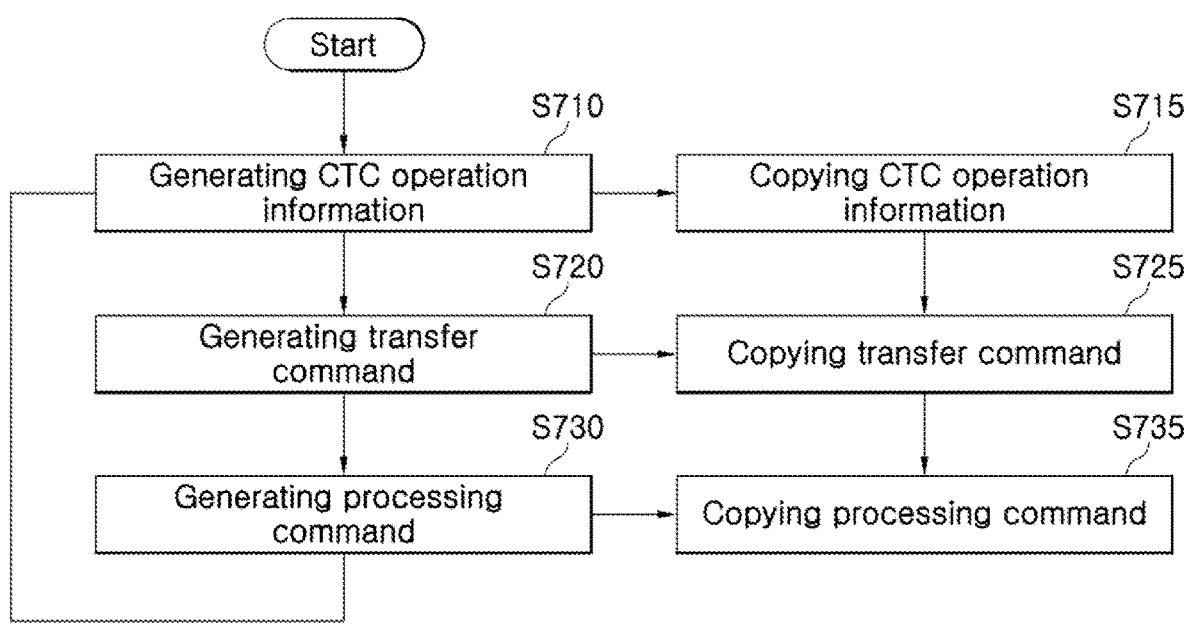
FIGS. 7 and 8 are flow charts showing operation of the CTCs operating while being synchronized with each other.
Figure 8:
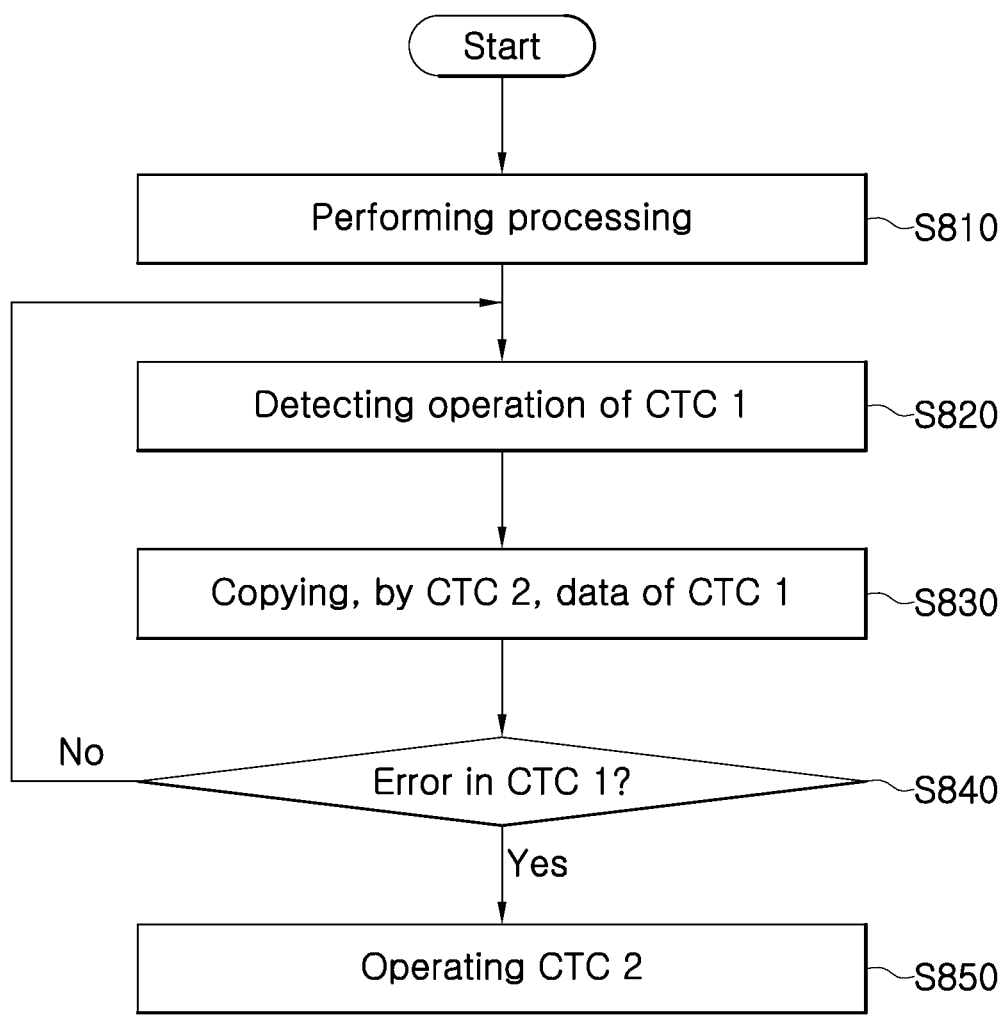

FIGS. 7 and 8 are flow charts showing operation of the CTC 10 operating while being synchronized with each other.

Referring to FIG. 7, the first CTC generates the CTC operation information with respect to a substrate loaded onto the substrate processing apparatus 1 at S710, generates a transfer command for transferring the substrate on the basis of the CTC operation information and transmits transfer command to the transfer module at S720, and generates a processing command for processing the substrate on the basis of the CTC operation information at S730.

The second CTC 12 copies and stores the CTC operation information at S715, copies and stores the transfer command at S725, and copies and stores the processing command at S735.

FIG. 8 is a flow chart showing an entire control of the substrate processing apparatus 1, and the operation in FIG. 7 may be an example in S820.

Referring to FIG. 8, in order to perform the process, the substrate is loaded onto the substrate processing apparatus 1 at S810, and each module TM, PM of the substrate processing apparatus is controlled by the first CTC 11 at S820. The second CTC 12 stores the data at S830, the data being same as the data of the first CTC while being synchronized with the first CTC 11 at S820. Then, whether an error occurs in the first CTC 11 to stop operating is monitored by the second CTC 12 or an external upper controller at S840.

When an error does not occur in the first CTC 11, processing operation is continuously performed by the first CTC 11. The second CTC 12 is synchronized with the first CTC 11 to copy and store the data. When an error occurs in the first CTC 11, the second CTC 12 (or upper controller) detects that an error occurs in the first CTC 11. When an error occurs in the first CTC 11, the second CTC 12 replaces the first CTC 11 to generate operation for controlling each module TM, PM of the substrate processing apparatus 1 and transmits the operation to the controller 21, 22 at S850.

When the first CTC 11 is restored, the second CTC 12 may transmit commands and data, which are stored from the time when the first CTC 11 stops operating, to the first CTC 11. Therefore, the substrate processing apparatus 1 may operate by the first CTC 11, and the second CTC 12 may be synchronized with the first CTC 11 to operate in case the first CTC 11 stops operating again.

According to an embodiment of the present disclosure, a method of operating the controlling apparatus, the controlling apparatus including the first CTC 11 controlling each module TM, PM of the substrate processing apparatus 1 and the second CTC 12 including the same configuration of software and hardware as the configuration of the first CTC 11 and being preset to perform the same operation as the operation of the first CTC 11, the method includes controlling, by the first CTC 11, each module TM, PM of the substrate processing apparatus 1 at S820, generating, by the second CTC 12, the commands and data synchronized with the first CTC 11 at S830, and when the first CTC 11 stops operating, controlling, by the second CTC 12, each module of the substrate processing apparatus in place of the first CTC 11 at S840.

According to the embodiment of the present disclosure, the controlling, by the first CTC 11, each module TM, PM of the substrate processing apparatus 1 may be performed by generating the CTC operation information about a substrate loaded onto the substrate processing apparatus 1 at S710, and by generating the transfer command for transferring the substrate on the basis of the CTC operation information at S720, and by generating the processing command for processing the substrate on the basis of the CTC operation information at S730.

According to the embodiment of the present disclosure, the generating, by the second CTC 12, the commands and data synchronized with the first CTC 11 may be performed by copying and storing the CTC operation information at S715, by copying and storing the transfer command at S725, and by copying and storing the processing command at S735.

According to the embodiment of the present disclosure, controlling, by the second CTC 12, each module of the substrate processing apparatus at S850 may be performed by, when an error occurs in the first CTC 11, generating and transmitting, by the second CTC 12 in place of the first CTC 11, operation for controlling each module TM, PM of the substrate processing apparatus 1.

The controlling method according to the embodiment of the present disclosure may be performed by, when the first CTC 11 is recovered, transmitting the commands and data, which are stored from time when the first CTC 11 stops operating, to the first CTC 11.

The controlling apparatus including the first and second CTCs 11 and 12 dualized to each other described above may be provided as a part of the substrate processing system. The substrate processing system according to the embodiment of the present disclosure includes the transfer module TM transferring a substrate, the processing module PM performing substrate processing, and the controlling module (e.g., the CTC 10). The controlling module includes the first CTC 11 controlling the transfer module TM and the processing module PM, and the second CTC 12 preset to perform the same operation as the operation of the first CTC 11 while including the same configuration of software and hardware as the configuration of the first CTC 11. When the first CTC 11 stops operating, the second CTC 12 is preset to control the transfer module TM and the processing module PM in place of the first CTC 11.

According to the embodiment of the present disclosure, the first CTC 11 may include the first processing unit 110 processing the data for controlling the transfer module TM and the processing module PM, the first storage unit 310 storing the data for controlling the transfer module TM and the processing module PM, and the first interface unit 210 exchanging the data with the second CTC 12.

According to the embodiment of the present disclosure, the second CTC 12 may include a second processing unit 120 synchronized with the first processing unit 110 and processing the data for controlling the transfer module TM and the processing module PM, a second storage unit 320 synchronized with the first storage unit 310 and storing the data for controlling the transfer module TM and the processing module PM, and a second interface unit 220 for data exchanging with the first CTC 11.

According to the embodiment of the present disclosure, each of the first storage unit 310 and second storage unit 320 may be preset to store an operation system 610 for controlling the transfer module TM and the processing module PM, an application 620 operating in environment of the operation system 610, and a virtual machine 630 for synchronization between the first CTC 11 and the second CTC 12.

According to the embodiment of the present disclosure, the first CTC 11 may generate the CTC operation information about a substrate loaded onto the transfer module TM, generate the transfer command for transferring the substrate on the basis of the CTC operation information, and generate the processing command for processing the substrate on the basis of the CTC operation information.

According to the embodiment of the present disclosure, the second CTC 12 may copy and store the CTC operation information from the first CTC 11, and copy and store the transfer command from the first CTC 11, and copy and store the processing command from the first CTC 11.

According to the embodiment of the present disclosure, the second CTC 12 detects an error in the first CTC 11, and when the error occurs in the first CTC 11, the second CTC 12 may generate and transmit commands indicating operation of the transfer module controller 21 for controlling the transfer module TM and the processing module controller 22 for controlling the processing module PM in place of the first CTC 11. When the first CTC 11 is restored, the second CTC 12 may transmit the commands and data stored from the time when the first CTC 11 stops operating to the first CTC 11.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific forms without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A controlling apparatus for controlling operation of a substrate processing apparatus having a plurality of processing modules, the controlling apparatus comprising:
   a first cluster tool controller (CTC) configured to control each processing module of the plurality of processing modules in the substrate processing apparatus; and
   a second CTC having the same configuration of a software and a hardware as configuration of a software and a hardware of the first CTC,
   wherein, when the first CTC stops operating, the second CTC controls each processing module of the plurality of processing modules in the substrate processing apparatus in place of the first CTC,
   wherein the first CTC comprises:
      a first processing unit configured to process data for controlling each processing module of the plurality of processing modules in the substrate processing apparatus;
      a first storage unit configured to store the data for controlling each processing module of the plurality of processing modules in the substrate processing apparatus; and
      a first interface unit configured to perform data exchanging with the second CTC, and
   wherein the second CTC comprises:
      a second processing unit configured to process the data for controlling each processing module of the plurality of processing modules in the substrate processing apparatus while operating in synchronization with the first processing unit;
      a second storage unit configured to store the data for controlling each processing module of the plurality of processing modules in the substrate processing apparatus while operating in synchronization with the first storage unit; and
      a second interface unit configured to perform data exchanging with the first CTC.

2. The controlling apparatus of claim 1,
   wherein each of the first storage unit and the second storage unit is configured to store therein:
      an operation system configured to control the substrate processing apparatus,
      an application configured to operate in environment of the operation system, and
      a virtual machine configured to synchronize the first CTC and the second CTC.

3. The controlling apparatus of claim 1,
   wherein the first CTC is configured to generate:
      CTC operation information about a substrate loaded onto the substrate processing apparatus,
      a transfer command for transferring the substrate on the basis of the CTC operation information, and
      a processing command for processing the substrate on the basis of the CTC operation information.

4. The controlling apparatus of claim 3,
   wherein the second CTC is configured to copy and store the CTC operation information, the transfer command, and the processing command.

5. The controlling apparatus of claim 1,
   wherein the second CTC is configured to:
      detect an error in the first CTC when an error occurs in the first CTC,
      receive data from the first CTC that stops operating,
      generate a command indicating operation of each processing module controller of the plurality of processing modules in the substrate processing apparatus for controlling a processing module of the plurality of processing modules in the substrate processing apparatus in place of the first CTC, and transmit the operation to each processing module of the plurality of processing modules in the substrate processing apparatus.

6. The controlling apparatus of claim 5,
wherein, when the first CTC is restored, the second CTC transmits commands and data for a process to be performed by each processing module of the plurality of processing modules by the first CTC to the first CTC.

7. An operation method of controlling a controlling apparatus, the controlling apparatus comprising a first cluster tool controller (CTC) configured to control each processing module of a plurality of processing modules in a substrate processing apparatus and a second CTC having the same configuration of a software and a hardware as configuration of a software and a hardware of the first CTC, the operation method comprising:
generating, by the first CTC, commands and data for each processing module of the plurality of processing modules in the substrate processing apparatus;
controlling, by the first CTC, each processing module of the plurality of processing modules in the substrate processing apparatus based on the commands and data;
generating, by the second CTC, the commands and data synchronized with the first CTC; and
controlling, by the second CTC in place of the first CTC in response to when the first CTC stops, each processing module of the plurality of processing modules in the substrate processing apparatus based on the commands and data generated by the second CTC.

8. The operation method of claim 7,
wherein the controlling, by the first CTC, each processing module of the plurality of processing modules in the substrate processing apparatus comprises:
generating CTC operation information about a substrate loaded onto the substrate processing apparatus;
generating a transfer command for transferring the substrate on the basis of the CTC operation information; and
generating a processing command for processing the substrate on the basis of the CTC operation information.

9. The operation method of claim 8,
wherein the generating, by the second CTC, the commands and data synchronized with the first CTC comprises:
copying and storing the CTC operation information;
copying and storing the transfer command; and
copying and storing the processing command.

10. The operation method of claim 7,
wherein the controlling, by the second CTC, each processing module of the plurality of processing modules in the substrate processing apparatus comprises:
when an error occurs in the first CTC, generating and transmitting, by the second CTC in place of the first CTC, a command indicating operation of each processing module controller of the plurality of processing modules in the substrate processing apparatus for controlling each processing module of the plurality of processing modules in the substrate processing apparatus.

11. The operation method of claim 10, further comprising:
when the first CTC is restored, transmitting to the first CTC, by the second CTC, commands and data for a process to be performed by each processing module of the plurality of processing modules by the first CTC.

12. A substrate processing system comprising:
a transfer module configured to transfer a substrate;
a processing module configured to perform a fabrication process on the substrate; and
a controlling module,
wherein the controlling module comprises:
a first cluster tool controller (CTC) configured to control the transfer module and the processing module; and
a second CTC having the same configuration of a software and a hardware as configuration of a software and a hardware of the first CTC,
wherein, when the first CTC stops operating, the second CTC controls the transfer module and the processing module in place of the first CTC,
wherein the first CTC comprises:
a first processing unit configured to process data for controlling the transfer module and the processing module;
a first storage unit configured to store the data for controlling the transfer module and the processing module; and
a first interface unit configured to perform data exchanging with the second CTC, and
wherein the second CTC comprises:
a second processing unit configured to process the data for controlling the transfer module and the processing module while operating in synchronization with the first processing unit;
a second storage unit configured to store the data for controlling the transfer module and the processing module while operating in synchronization with the first storage unit; and
a second interface unit configured to perform data exchanging with the first CTC.

13. The substrate processing system of claim 12,
wherein each of the first storage unit and the second storage unit is configured to store therein an operation system configured to control the transfer module and the processing module, an application configured to operate in environment of the operation system, and a virtual machine configured to synchronize the first CTC and the second CTC with each other.

14. The substrate processing system of claim 12,
wherein the first CTC is configured to generate CTC operation information about a substrate loaded onto the transfer module, a transfer command for transferring the substrate on the basis of the CTC operation information, and a processing command for processing the substrate on the basis of the CTC operation information.

15. The substrate processing system of claim 14,
wherein the second CTC, when receiving the CTC operation information from the first CTC, copies and stores the CTC operation information, and
wherein the second CTC, when receiving the transfer command from the first CTC, copies and stores the transfer command, and
wherein the second CTC, when receiving the processing command from the first CTC, copies and stores the processing command.

16. The substrate processing system of claim 12,
wherein the second CTC is configured to detect an error in the first CTC, and
wherein the second CTC, when an error occurs in the first CTC, generates and transmits commands indicating operation of a transfer module controller for controlling the transfer module and a processing module controller for controlling the processing module in place of the first CTC, and wherein the second CTC, when the first CTC is restored, transmits commands and data, which are stored from time when the first CTC stops operating, to the first CTC.

\* \* \* \* \*